(12) United States Patent
Thomas et al.

(10) Patent No.: US 12,457,771 B2
(45) Date of Patent: Oct. 28, 2025

(54) PLUG AND RECESS PROCESS FOR DUAL METAL GATE ON STACKED NANORIBBON DEVICES

(71) Applicant: Intel Corporation, Santa Clara, CA (US)

(72) Inventors: Nicole Thomas, Portland, OR (US); Michael K. Harper, Hillsboro, OR (US); Leonard P. Guler, Hillsboro, OR (US); Marko Radosavljevic, Portland, OR (US); Thoe Michaelos, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/736,428

(22) Filed: Jun. 6, 2024

(65) Prior Publication Data
US 2024/0332389 A1 Oct. 3, 2024

Related U.S. Application Data

(63) Continuation of application No. 16/911,705, filed on Jun. 25, 2020, now Pat. No. 12,046,652.

(51) Int. Cl.
| | |
|---|---|
| *H10D 30/67* | (2025.01) |
| *H01L 21/02* | (2006.01) |
| *H01L 21/768* | (2006.01) |
| *H10D 62/10* | (2025.01) |
| *H10D 84/01* | (2025.01) |
| *H10D 84/03* | (2025.01) |

(52) U.S. Cl.
CPC ..... *H10D 30/6735* (2025.01); *H01L 21/0228* (2013.01); *H01L 21/76897* (2013.01); *H10D 62/119* (2025.01); *H10D 84/0128* (2025.01); *H10D 84/038* (2025.01)

(58) Field of Classification Search
CPC ............ H10D 30/6735; H10D 62/119; H10D 84/038; H10D 30/6757; H10D 88/00; H10D 84/0177; H01L 21/76897
See application file for complete search history.

(56) References Cited

U.S. PATENT DOCUMENTS

| | | |
|---|---|---|
| 2014/0091360 A1 | 4/2014 | Pillarisetty |
| 2019/0196830 A1* | 6/2019 | Lilak ...................... H10D 88/01 |
| 2022/0093613 A1 | 3/2022 | Moriwaki |

* cited by examiner

*Primary Examiner* — Samuel A Gebremariam
(74) *Attorney, Agent, or Firm* — Schwabe, Williamson & Wyatt P.C.

(57) ABSTRACT

Embodiments disclosed herein include semiconductor devices and methods of making such devices. In an embodiment, the semiconductor device comprises a plurality of stacked semiconductor channels comprising first semiconductor channels and second semiconductor channels over the first semiconductor channels. In an embodiment a spacing is between the first semiconductor channels and the second semiconductor channels. The semiconductor device further comprises a gate dielectric surrounding individual ones of the semiconductor channels of the plurality of stacked semiconductor channels. In an embodiment, a first workfunction metal surrounds the first semiconductor channels, and a second workfunction metal surrounds the second semiconductor channels.

26 Claims, 11 Drawing Sheets

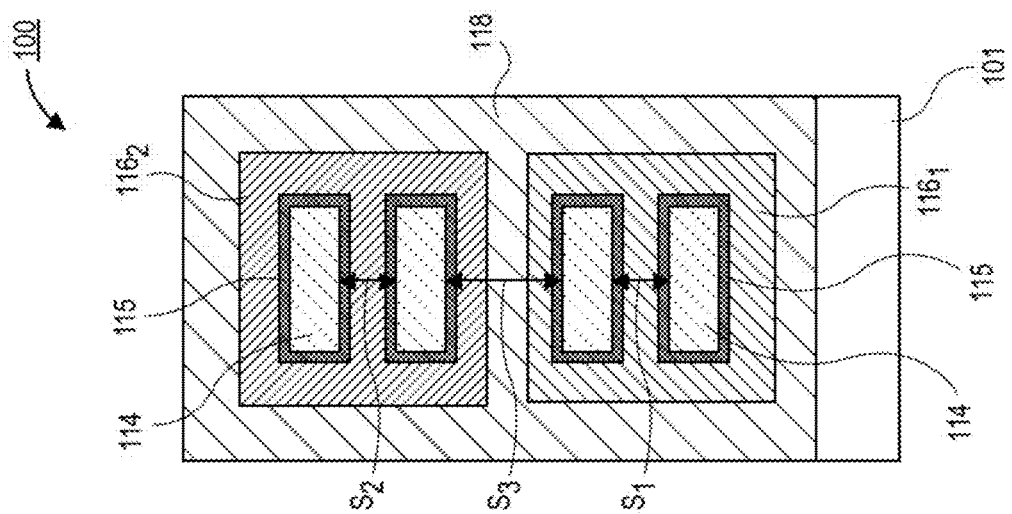
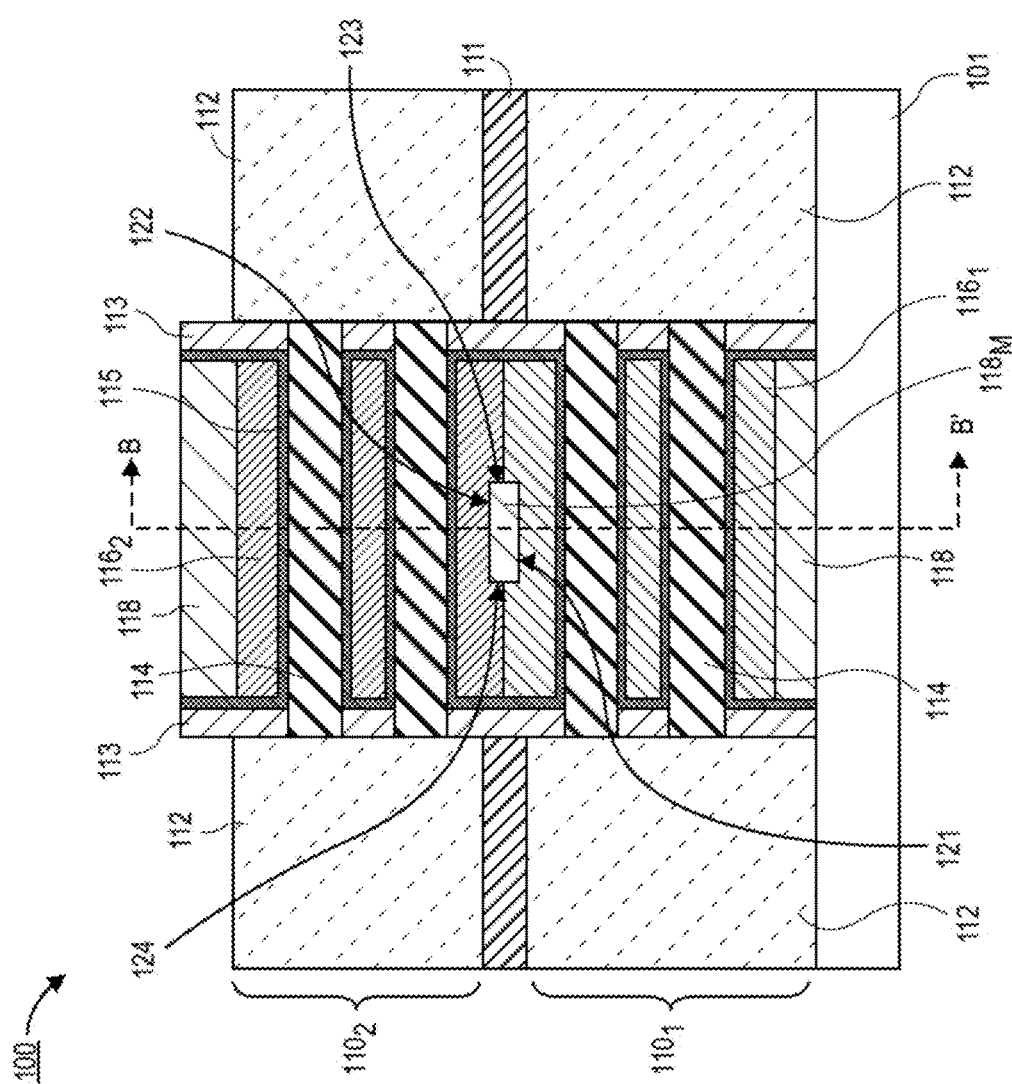
FIG. 1A
FIG. 1B

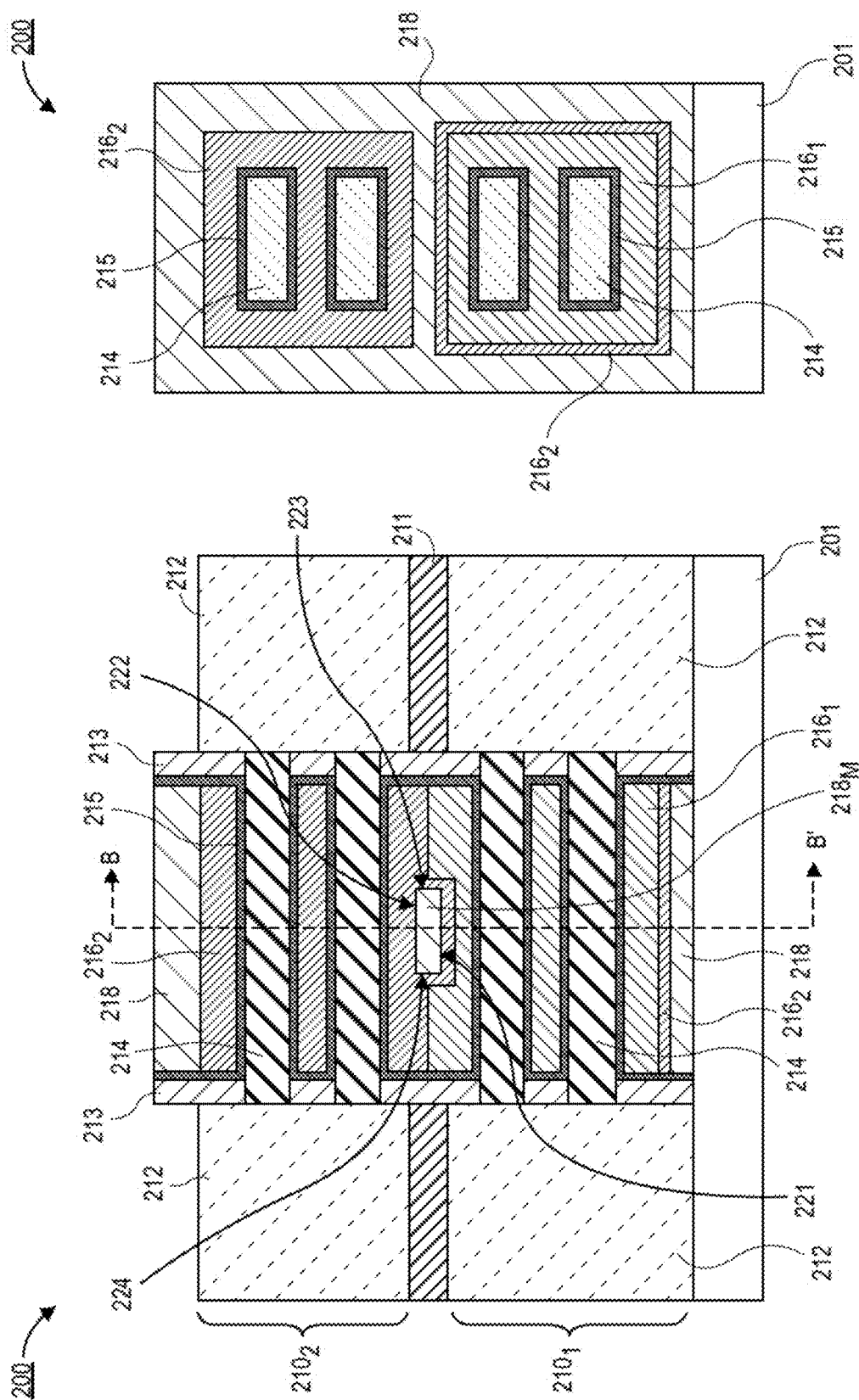

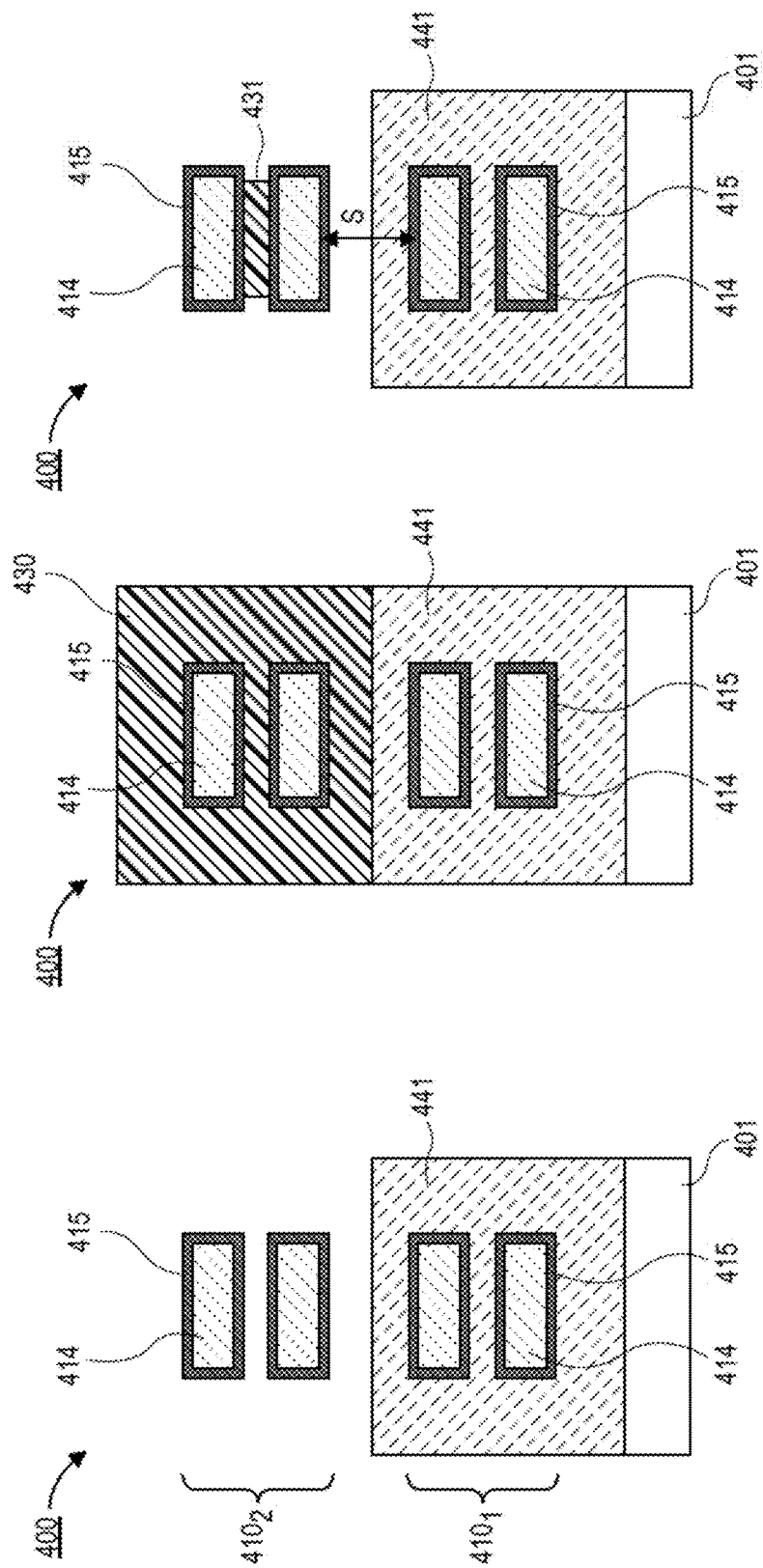

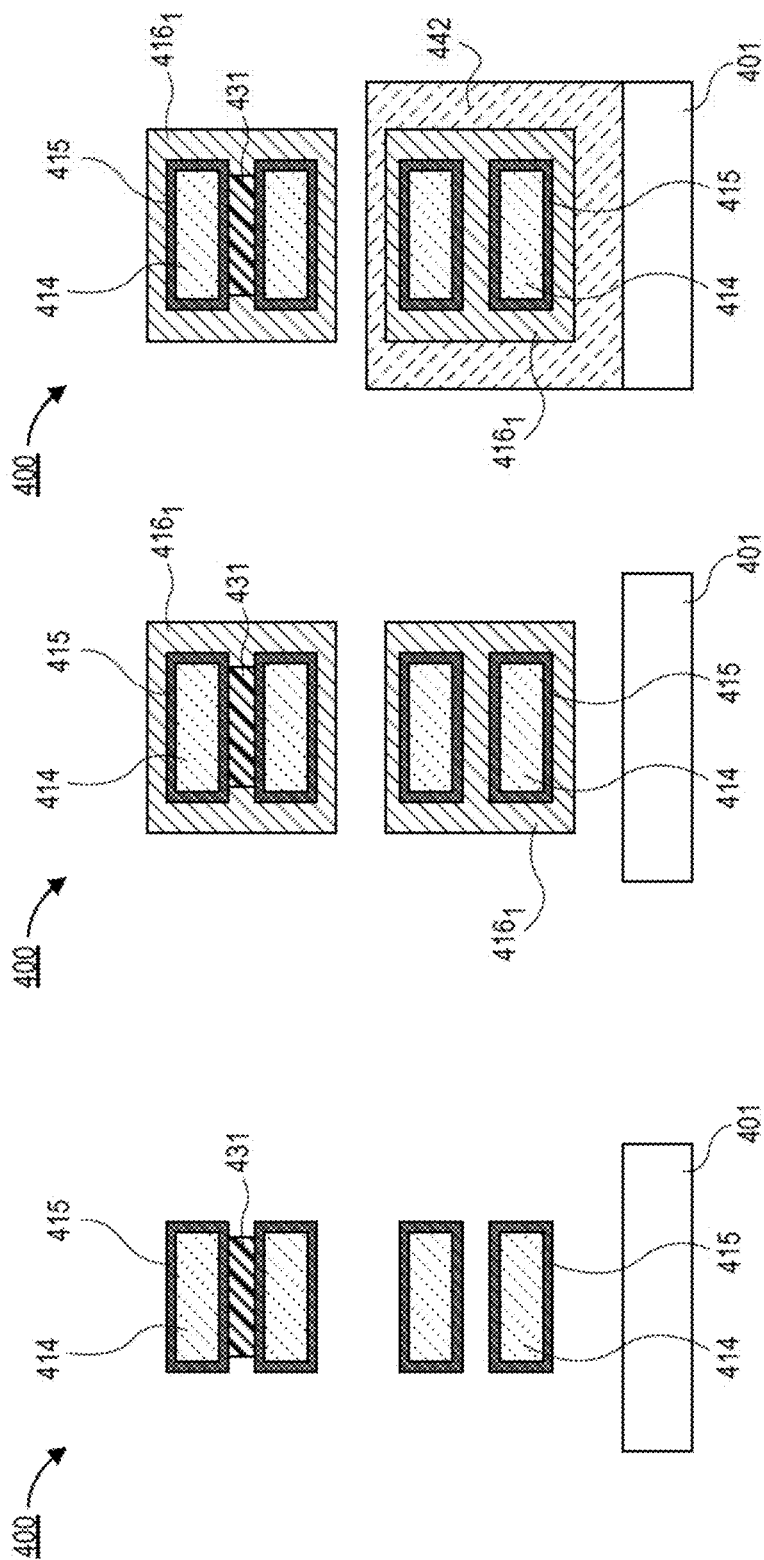

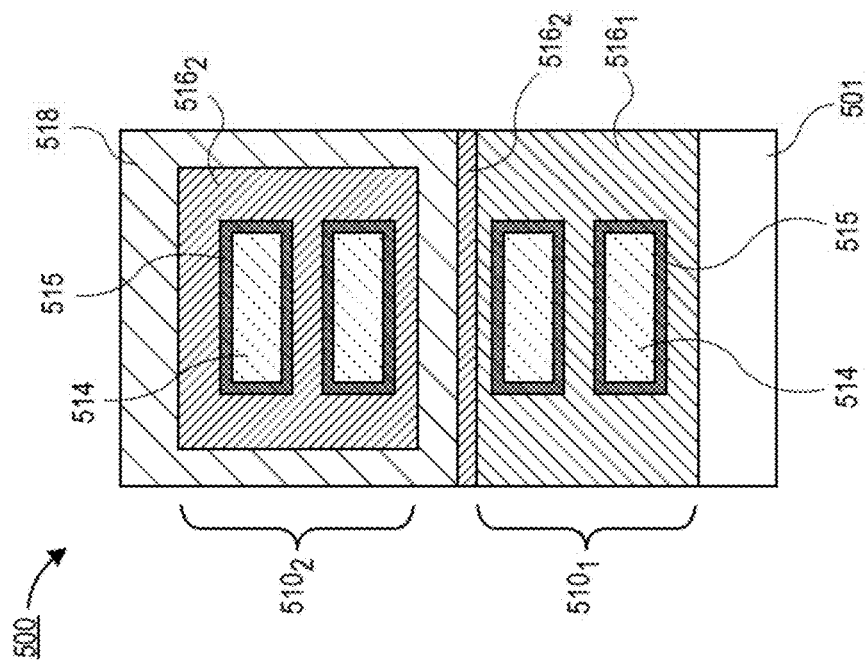
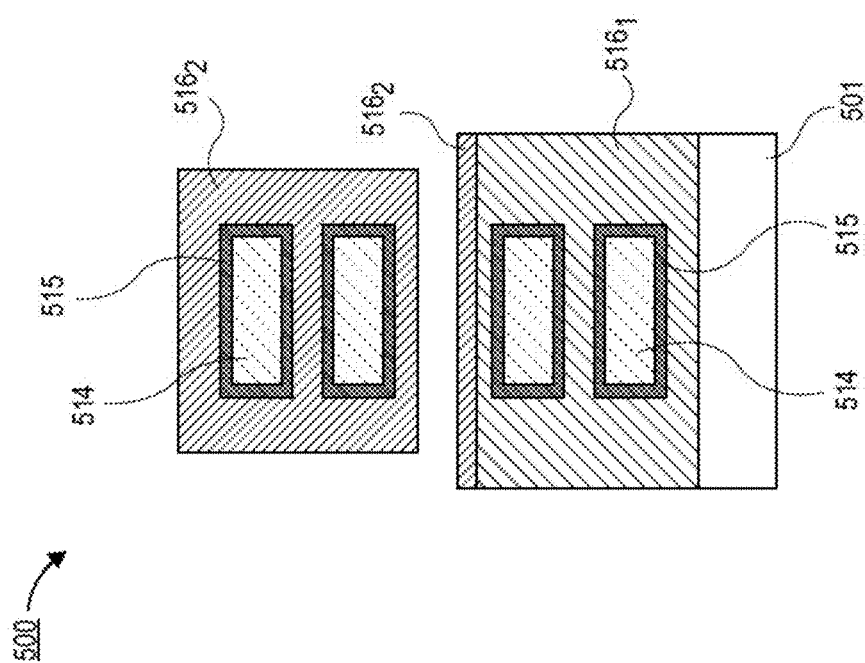

PLUG AND RECESS PROCESS FOR DUAL METAL GATE ON STACKED NANORIBBON DEVICES

CROSS-REFERENCE TO RELATED APPLICATIONS

This application is a continuation of U.S. patent application Ser. No. 16/911,705, filed on Jun. 25, 2020, the entire contents of which is hereby incorporated by reference herein.

TECHNICAL FIELD

Embodiments of the present disclosure relate to semiconductor devices, and more particularly to stacked nanoribbon devices formed with a plug and recess process to enable dual workfunction metal.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, gate-all-around (GAA) transistors, such as nanowire or nanoribbon transistors, have become more prevalent as device dimensions continue to scale down. Scaling GAA transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 1A is a cross-sectional illustration of a semiconductor device with a first transistor and a second transistor stacked over the first transistor along the length of the channels, in accordance with an embodiment.

FIG. 1B is a cross-sectional illustration of the semiconductor device in FIG. 1A along line B-B', in accordance with an embodiment.

FIG. 2A is a cross-sectional illustration of a semiconductor device with a first transistor and a second transistor stacked over the first transistor along the length of the channels, in accordance with an additional embodiment.

FIG. 2B is a cross-sectional illustration of the semiconductor device in FIG. 2A along line B-B', in accordance with an embodiment.

FIGS. 4A-4K are cross-sectional illustrations depicting a process for forming a semiconductor device, in accordance with an embodiment.

FIGS. 5A-5F are cross-sectional illustrations depicting a process for forming a semiconductor device, in accordance with an additional embodiment.

EMBODIMENTS OF THE PRESENT DISCLOSURE

Figure 3B:
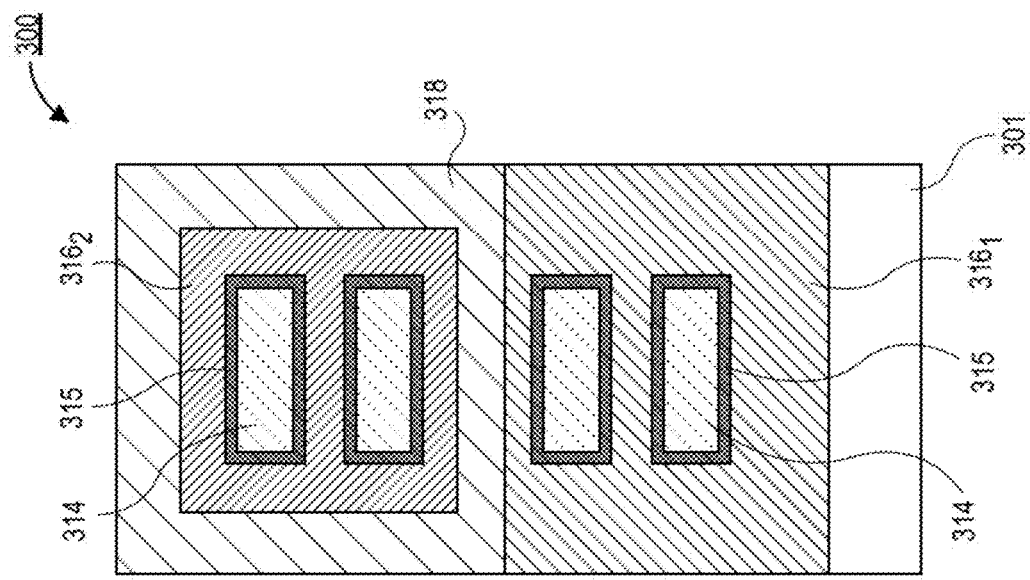
FIGS. 3A and 3B are cross-sectional illustrations of semiconductor devices, in accordance with additional embodiments.

Described herein are stacked nanoribbon devices formed with a plug and recess process to enable dual workfunction metal, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, scaling of GAA devices is not without issues. One particular issue that has arisen is in the integration of N-type and P-type transistors within a single stack. In order to stack both types of transistors, a first workfunction metal (e.g., a P-type workfunction metal) is disposed around all of the nanoribbon channels in the stack. Subsequently, the first workfunction metal is etched away from the top nanoribbon channels and is replaced with a second workfunction metal (e.g., an N-type workfunction metal). However, as the spacing between channels is reduced, it becomes increasingly difficult to remove the first workfunction metal from between the top nanoribbon channels without negatively affecting the first workfunction metal around the bottom transistors.

In order to overcome the etching difficulties of clearing the first workfunction metal from the top nanoribbon channels, the distance between the top nanoribbon channels and the bottom nanoribbon channels needs to be increased. For example, current spacings between the nanoribbon channels of the top transistor and the bottom transistor are approximately 50 nm or greater. The increased spacing is undesirable because it results in increases in the fin height. This is particularly problematic as more nanoribbon channels are added to each transistor in the stack. Increased fin height causes difficulties with shallow trench isolation (STI) and polysilicon processing. Additionally, the spacing between the nanoribbon channels should be small due to capacitance considerations for optimal device performance. For example, the ribbon-to-ribbon spacing for each transistor should be approximately 15 nm or less, and the spacing between the N-type device and the P-type device should also be reduced as well (e.g., less than 50 nm, or less than 20 nm).

Accordingly, embodiments disclosed herein include the formation of stacked GAA transistor devices using a sacrificial plug material. The sacrificial plug material is disposed between the semiconductor channels of the top transistor before depositing the first workfunction material. As such, the first workfunction metal will not fill the spacings between the top semiconductor channels. This allows for the etching time needed to clear the first workfunction metal to be reduced, and reduces the spacing between the semiconductor channels of the bottom transistor from the semiconductor channels of the top transistor. For example, embodiments that utilize such a sacrificial plug process may be able to have spacings between the top semiconductor channels and the bottom semiconductor channels that are approximately 50 nm or less, or approximately 20 nm or less.

Referring now to FIG. 1A a cross-sectional illustration of a semiconductor device 100 is shown, in accordance with an embodiment. In an embodiment, semiconductor device 100 is disposed over an underlying substrate 101. The underlying substrate 101 represents a general workpiece object used to manufacture integrated circuits. The semiconductor substrate 101 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the semiconductor device 100 comprises a first transistor $110_1$ and a second transistor $110_2$ that are stacked over the substrate 101. The first transistor $110_1$ may be a first conductivity type and the second transistor $110_2$ may be a second conductivity type. For example, the first transistor $110_1$ may be P-type and the second transistor $110_2$ may be N-type.

In an embodiment, transistors $110_1$ and $110_2$ may each comprise a pair of source/drain (S/D) regions 112 that are on opposite ends of semiconductor channels 114. In an embodiment, the portions of the fin outside of spacers 113 may be etched to form recesses adjacent to the semiconductor channels 114. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. The S/D regions 112 of the first transistor $110_1$ may be electrically isolated from the S/D regions 112 of the second transistor $110_2$ by an insulating layer 111.

In an embodiment, the semiconductor channels 114 may comprise any suitable semiconductor material. In a particular embodiment, the semiconductor channels 114 may comprise silicon. The semiconductor channels 114 may be nanoribbon channels or nanowire channels. As used herein, references to nanoribbon channels may be considered as also including nanowire channels, and vice versa. In the illustrated embodiment, each transistor $110_1$ and $110_2$ comprises a pair of semiconductor channels 114. However, it is to be appreciated that each transistor $110_1$ and $110_2$ may comprise any number of semiconductor channels 114.

In an embodiment, the semiconductor channels 114 may be surrounded by a gate dielectric 115. The gate dielectric 115 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

In an embodiment, workfunction metals 116 may surround the gate dielectric 115 and the nanoribbon channels 114. In some embodiments, a barrier layer (not shown) may separate the gate dielectric 115 from the workfunction metals 116. A first workfunction metal $116_1$ is disposed around the nanoribbon channels 114 of the first transistor $110_1$ and a second workfunction metal $116_2$ is disposed around the nanoribbon channels 114 of the second transistor $110_2$.

The first workfunction metal $116_1$ and the second workfunction metal $116_2$ are materials suitable for the different conductivity types. In an embodiment, the first workfunction metal $116_1$ is an N-type workfunction metal, and the second workfunction metal $116_2$ is a P-type workfunction metal. In other embodiments, the first workfunction metal $116_1$ and the second workfunction metal $116_2$ may be different N-type workfunction metals or different P-type workfunction metals. When the workfunction metal 116 will serve as an N-type workfunction metal, the workfunction metal 116 preferably has a workfunction that is between about 3.9 eV and about 4.2 eV. N-type materials that may be used to form the workfunction metal 116 include, but are not limited to, hafnium, zirconium, titanium, tantalum, aluminum, and metal carbides that include these elements, i.e., titanium carbide, zirconium carbide, tantalum carbide, hafnium carbide, aluminum carbide, and titanium aluminum carbide. When the workfunction metal 116 will serve as a P-type workfunction metal, the workfunction metal 116 preferable has a workfunction that is between about 4.9 eV and about 5.2 eV. P-type materials that may be used to form the workfunction metal 116 include, but are not limited to, ruthenium, palladium, platinum, cobalt, nickel, titanium nitride, tungsten, and conductive metal oxides, e.g., ruthenium oxide.

In an embodiment, a gate fill metal 118 may fill the remaining space between the spacers 113. The gate fill metal 118 may be tungsten or any other suitable conductive material. In an embodiment, the gate fill metal 118, the first workfunction metal $116_1$, and the second workfunction metal $116_2$ are electrically coupled together. As such, the gate control of the first transistor $110_1$ and the gate control of the second transistor $110_2$ are coupled together.

In the illustrated embodiment, the gate fill metal 118 is shown as being below the first workfunction metal $116_1$ and over the second workfunction metal $116_2$. In an embodiment, a portion $118_M$ of the gate fill metal 118 may be between the nanoribbon channels 114 of the first transistor $110_1$ and the second transistor $110_2$. The portion $118_M$ may have surfaces 121-124 that are surrounded by the first workfunction metal $116_1$ and the second workfunction metal $116_2$. As shown, the first workfunction metal $116_1$ may have a U-shaped cross-section that covers the first surface 121 and extends up two sidewall surfaces 123 and 124. The second workfunction metal $116_2$ may also have a U-shaped cross-section that covers the second surface 122 and extends down the two sidewall surfaces 123 and 124.

Referring now to FIG. 1B, a cross-sectional illustration of the semiconductor device 100 in FIG. 1A along line B-B' is shown, in accordance with an embodiment. In FIG. 1B, the nanoribbon channels 114 are shown as being entirely surrounded by the gate dielectric 115 and the workfunction metals $116_1$ or $116_2$. FIG. 1B also clearly shows the different spacings between the nanoribbon channels 114. In an embodiment, the bottom nanoribbon channels 114 (of the first transistor $110_1$) have a first spacing $S_1$, and the top nanoribbon channels 114 (of the second transistor $110_2$) have a second spacing $S_2$. In an embodiment, the first spacing $S_1$ may be substantially equal to the second spacing $S_2$. In other embodiments, the first spacing $S_1$ is different than the second spacing $S_2$. In a particular embodiment, the first spacing $S_1$ and the second spacing $S_2$ are approximately 10 nm or smaller.

In an embodiment, the bottom nanoribbon channels 114 (of the first transistor $110_1$) are spaced away from the top nanoribbon channels 114 (of the second transistor $110_2$) by a third spacing $S_3$. In an embodiment, the third spacing $S_3$ may be approximately 50 nm or less, or approximately 20 nm or less. The relatively small third spacing $S_3$ is made possible using sacrificial plug processing operations that will be described in greater detail below. That is, without the use of sacrificial plug processes, the third spacing $S_3$ would need to be greater than approximately 50 nm in order to provide functional devices. The reduction in the third spacing $S_3$ allows for a decrease in the total fin height, which in turns makes STI and polysilicon processing easier. That is, reduction of the third spacing $S_3$ enables multi-ribbon devices (e.g., greater than 2 ribbons per stacked transistor) especially when STI and polysilicon processing are limiting factors.

Referring now to FIG. 2A, a cross-sectional illustration of a semiconductor device 200 is shown, in accordance with an embodiment. The semiconductor device 200 may comprise a first transistor $210_1$ and a second transistor $210_2$ stacked over a substrate 201. The transistors $210_1$ and $210_2$ may comprise semiconductor channels 214 with S/D regions 212 outside of spacers 213 on opposite ends of the semiconductor channels 214. The S/D regions 212 of the first transistor $210_1$ may be separated from the S/D regions 212 of the second transistor $210_2$ by an insulating layer 211.

In an embodiment, the semiconductor channels 214 may be surrounded by a gate dielectric 215. The gate dielectric 215 may be a high-k dielectric material, such as those described above. The gate dielectric 215 of the first transistor $210_1$ may be surrounded by a first workfunction metal $216_1$ and the gate dielectric 215 of the second transistor $210_2$ may be surrounded by a second workfunction metal $216_2$. For example, the first workfunction metal $216_1$ may be a P-type workfunction material and the second workfunction metal $216_2$ may be an N-type workfunction material. In other embodiments, the first workfunction metal $216_1$ and the second workfunction metal $216_2$ may be different N-type workfunction metals or different P-type workfunction metals.

In an embodiment, the second workfunction metal $216_2$ may also surround the first workfunction metal $216_1$. For example, the second workfunction metal $216_2$ may separate the first workfunction metal $216_1$ from the gate fill metal 218. This architecture is clearly shown in FIG. 2B. As shown, a layer of the second workfunction metal $216_2$ wraps around a perimeter of the first workfunction metal $216_1$.

Since the second workfunction metal $216_2$ lines the first workfunction metal $216_1$ a portion $218_M$ of the gate fill metal 218 between the first transistor $210_1$ and the second transistor $210_2$ may be entirely surrounded by the second workfunction metal $216_2$. That is, surfaces 221-224 may be contacted by the second workfunction metal $216_2$.

Figure 3A:
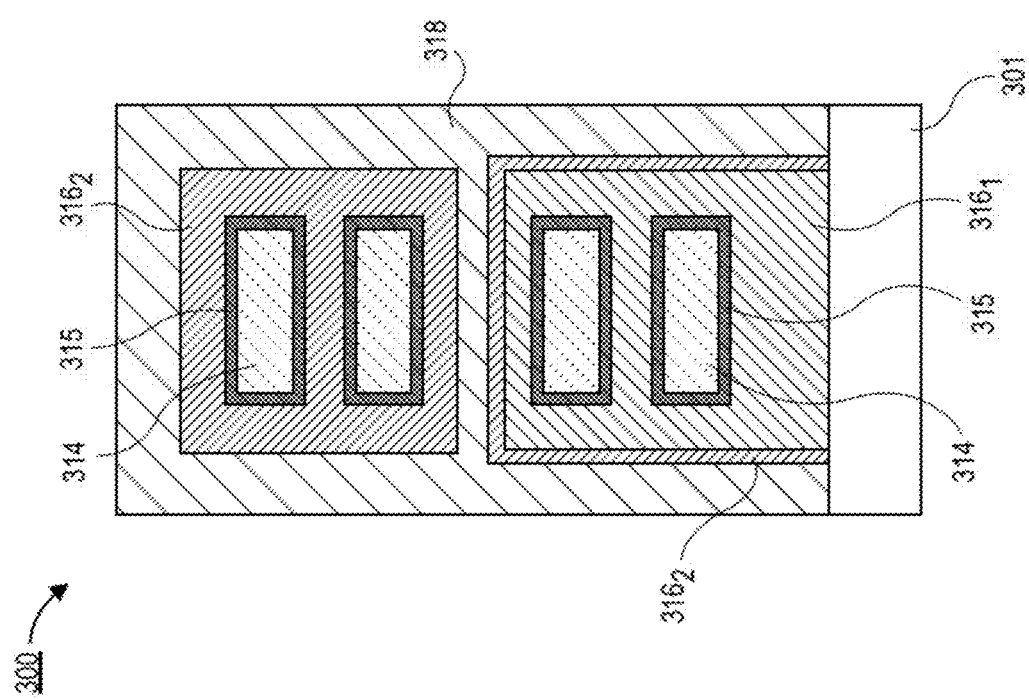

Referring now to FIGS. 3A and 3B, cross-sectional illustrations of semiconductor devices 300 are shown, in accordance with additional embodiments. In FIGS. 3A and 3B, stacks of semiconductor channels 314 over a substrate 301 are shown. The bottom two semiconductor channels 314 are for a first transistor device and the top two semiconductor channels 314 are for a second transistor device. The semiconductor channels 314 may be lined by a gate dielectric 315.

In FIG. 3A, a first workfunction metal $316_1$ surrounds the bottom semiconductor channels 314 and a second workfunction metal $316_2$ surrounds the top semiconductor channels 314. A gate fill metal 318 surrounds the workfunction metals $316_1$ and $316_2$. In an embodiment, the second workfunction metal $316_2$ surrounds three surfaces of the first workfunction metal $316_1$. Particularly, the bottom surface of the first workfunction metal $316_1$ is in direct contact with the substrate 301. As shown, portions of the gate fill metal 318 may also contact the substrate 301.

In FIG. 3B, the first workfunction metal $316_1$ covers the entire bottom surface of the substrate 301 shown in the cross-sectional view. As such, there are no vertical sidewalls or bottom surface that are able to be lined with the second workfunction metal $316_2$. In the illustrated embodiment, the top surface of the first workfunction metal $316_1$ may be contacted by the gate fill metal 318.

Referring now to FIGS. 4A-4K, a series of cross-sectional illustrations depicting a process for forming a semiconductor device 400 is shown, in accordance with an embodiment.

Referring now to FIG. 4A, a cross-sectional illustration (across the fin in the channel region) is shown, in accordance with an embodiment. The semiconductor device 400 includes a first transistor $410_1$ and a second transistor $410_2$ over the first transistor $410_1$. The transistors 410 may be stacked over a substrate 401. In an embodiment, each transistor 410 may comprise one or more semiconductor channels 414. While two semiconductor channels 414 are provided in each transistor 410, it is to be appreciated that the transistors 410 may each comprise any number of semiconductor channels 414.

In an embodiment, the semiconductor channels 414 may be surrounded by a gate dielectric 415. The gate dielectric 415 may be a high-k dielectric material, such as those described above. In an embodiment, a barrier layer (not shown) may surround the gate dielectric 415.

In an embodiment, a first mask layer 441 may be disposed over the semiconductor device 400. The first mask layer 441 may be blanket deposited and recessed. The recessing exposes the semiconductor channels 414 of the second transistor $410_2$, while covering the semiconductor channels 414 of the first transistor $410_1$.

Referring now to FIG. 4B, a cross-sectional illustration of the semiconductor device 400 after a sacrificial plug material 430 is disposed over the semiconductor channels 414 of the second transistor device $410_2$ is shown, in accordance with an embodiment. In an embodiment, the sacrificial plug material 430 may be a material that is etch selective to the gate dielectric, the barrier layer, and the spacers (not shown in the cross-section). For example, the sacrificial plug material 430 may comprise aluminum and oxygen (e.g., $AlO_x$) or silicon and oxygen (e.g., $SiO_x$). In an embodiment, the sacrificial plug material 430 is deposited with an atomic layer deposition (ALD) process.

Referring now to FIG. 4C, a cross-sectional illustration of the semiconductor device 400 after the sacrificial plug material 430 is etched is shown, in accordance with an embodiment. As shown, the etching process removes the sacrificial plug material 430 from around the semiconductor channels 414, while leaving a sacrificial plug 431 between the semiconductor channels 414. For example, the etching process may be an isotropic etch in order to maintain the sacrificial plug 431 between the semiconductor channels 414. The sacrificial plug 431 prevents subsequently deposited first workfunction material from being disposed between the semiconductor channels 414. This reduces the etching time needed to clear the first workfunction material from the second transistor $410_2$. As such, a spacing S between the semiconductor channels 414 of the first transistor $410_1$ and the second transistor $410_2$ can be reduced. For example, the spacing S may be approximately 50 nm or less, or approximately 20 nm or less.

Referring now to FIG. 4D, a cross-sectional illustration of the semiconductor device 400 after the first mask layer 441 is removed is shown, in accordance with an embodiment. In an embodiment, the first mask layer 441 may be removed with any suitable process that selectively removes the first mask layer 441.

Referring now to FIG. 4E, a cross-sectional illustration of the semiconductor device 400 after a first workfunction metal $416_1$ is disposed around the semiconductor channels 414 is shown, in accordance with an embodiment. In an embodiment, the first workfunction metal $416_1$ may be deposited with a conformal deposition process, such as an ALD process. In some embodiments, a portion of the first workfunction metal $416_1$ may also be deposited over the substrate 401. The first workfunction metal $416_1$ is blocked from being deposited between the semiconductor channels 414 of the second transistor $410_2$ by the sacrificial plug 431. The first workfunction metal $416_1$ may be any suitable workfunction material, such as those described above.

Referring now to FIG. 4F, a cross-sectional illustration of the semiconductor device 400 after a second mask layer 442 is disposed is shown, in accordance with an embodiment. The second mask layer 442 may be deposited and recessed so that a top surface is below the semiconductor channels 414 of the second transistor $410_2$.

Figure 4I:
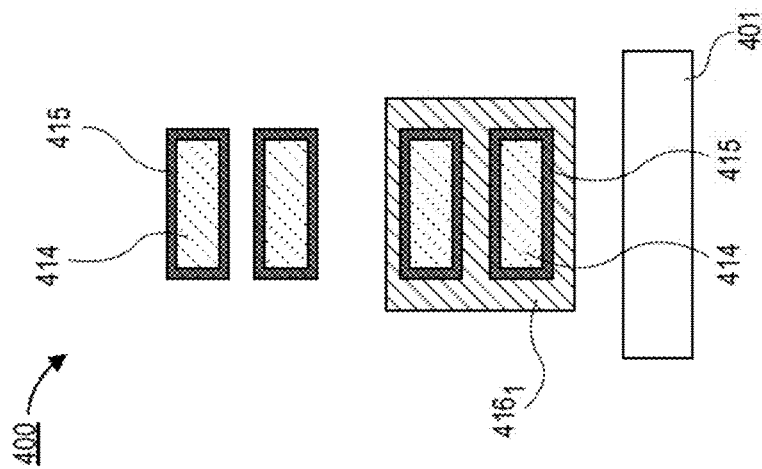
Figure 4H:
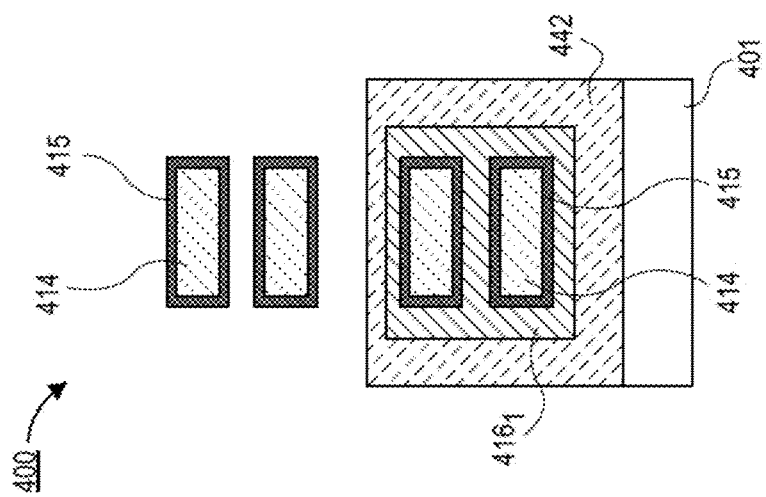
Figure 4G:
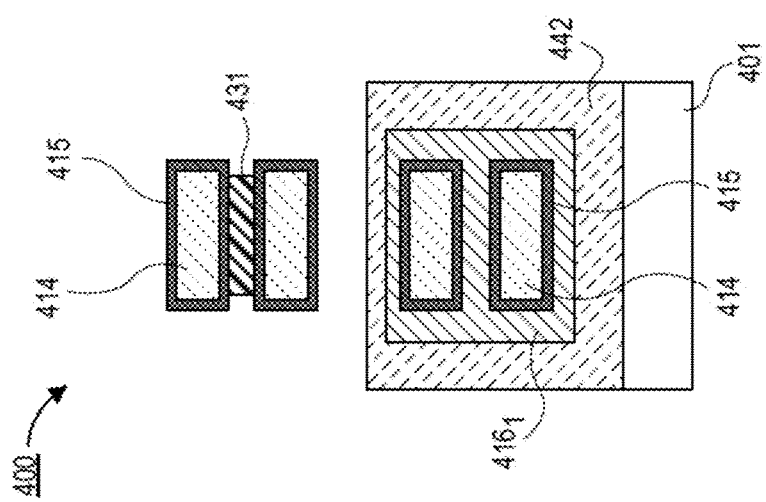

Referring now to FIG. 4G, a cross-sectional illustration of the semiconductor device 400 after the first workfunction metal $416_1$ is removed from around the semiconductor channels 414 of the second transistor $410_2$ is shown, in accordance with an embodiment. Since there is no first workfunction metal $416_1$ in the small spacing (e.g., 10 nm or smaller) between the semiconductor channels 414, the duration of the etching process may be reduced.

Referring now to FIG. 4H, a cross-sectional illustration of the semiconductor device 400 after the sacrificial plug 431 is removed is shown, in accordance with an embodiment. The sacrificial plug 431 may be removed with an etching process that selectively removes the sacrificial plug 431 without damaging the gate dielectric 415 or any of the barrier layers or workfunction metal already present on the semiconductor device 400.

Referring now to FIG. 4I, a cross-sectional illustration of the semiconductor device 400 after the second mask layer 442 is removed is shown, in accordance with an embodiment. The second mask layer 442 may be removed with any suitable process for selectively removing the material of the second mask layer 442.

Figure 4K:
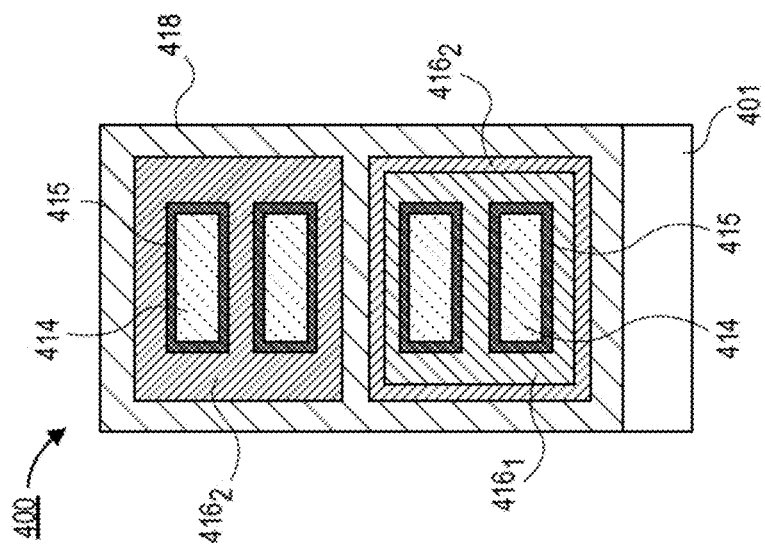
Figure 4J:
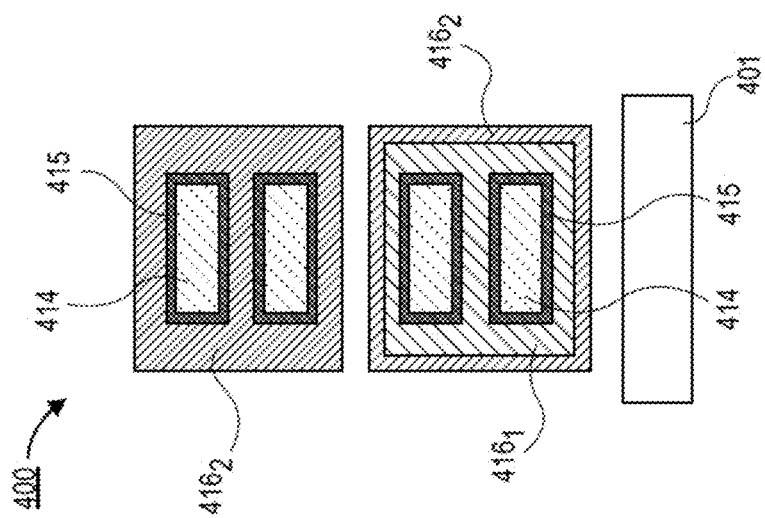

Referring now to FIG. 4J, a cross-sectional illustration of the semiconductor device 400 after a second workfunction metal $416_2$ is disposed over surfaces is shown, in accordance with an embodiment. In an embodiment, the second workfunction metal $416_2$ may be disposed with an ALD process. The second workfunction metal $416_2$ wraps around the semiconductor channels 414 of the second transistor $410_2$. Additionally, a layer of the second workfunction metal $416_2$ may surround a perimeter of the first workfunction metal $416_1$. The second workfunction metal $416_2$ is a different material than the first workfunction metal $416_1$. For example, the first workfunction metal $416_1$ may be a P-type workfunction material, and the second workfunction metal $416_2$ may be an N-type workfunction material.

Referring now to FIG. 4K, a cross-sectional illustration of the semiconductor device 400 after a gate fill metal 418 is disposed over surfaces is shown, in accordance with an embodiment. The gate fill metal 418 may be tungsten or the like. In an embodiment, the gate fill metal 418 provides electrical coupling between the first transistor $410_1$ and the second transistor $410_2$. Particularly, the gates of the first transistor $410_1$ and the second transistor $410_2$ are controlled together. In an embodiment, the gate fill metal 418 may be tungsten or any other suitable conductive material.

Referring now to FIGS. 5A-5F, a series of cross-sectional illustrations depicting a process for forming a semiconductor device 500 is shown, in accordance with an embodiment. The processing of the semiconductor device 500 may begin with operations substantially similar to those in FIGS. 4A-4D. For example, the semiconductor device 500 comprises a stack of semiconductor channels 514 over a substrate 501. The semiconductor channels 514 are surrounded by a gate dielectric 515. In an embodiment, a sacrificial plug 531 is disposed between the top semiconductor channels 514.

Figure 5A:
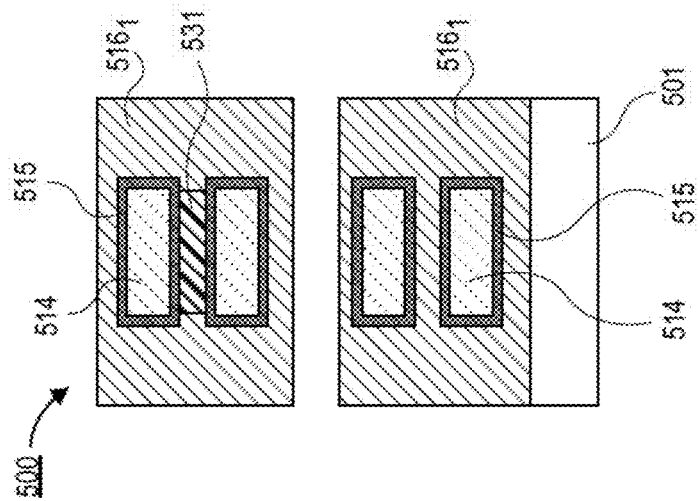

Referring now to FIG. 5A, a cross-sectional illustration of the semiconductor device 500 after the first workfunction metal $516_1$ is disposed around surfaces of semiconductor channels 514 is shown, in accordance with an embodiment. In an embodiment, the first workfunction metal $516_1$ may grow so that it contacts the surface of the substrate 501. That is, there may be no space between the first workfunction metal $516_1$ and the substrate 501. In an embodiment, the first workfunction metal $516_1$ may be any suitable workfunction material, such as those described above. Additionally, the sacrificial plug 531 prevents the first workfunction metal $516_1$ from depositing between the top semiconductor channels 514.

Figure 5D:
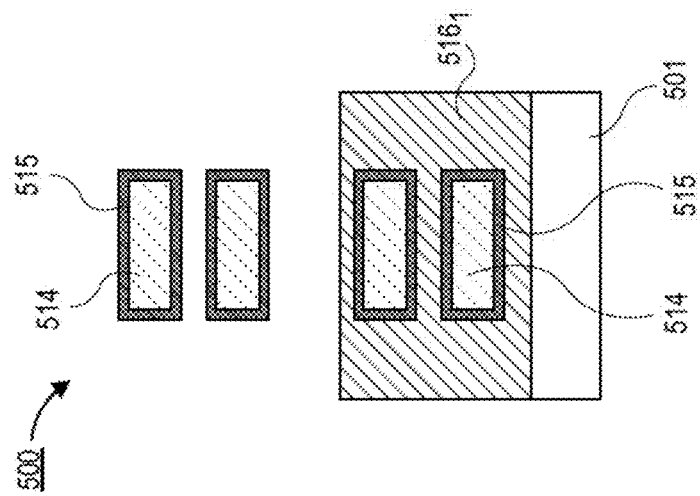
Figure 5C:
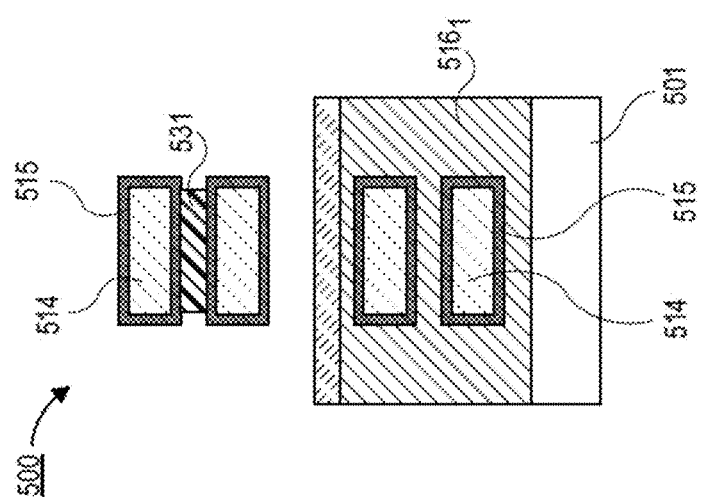
Figure 5B:
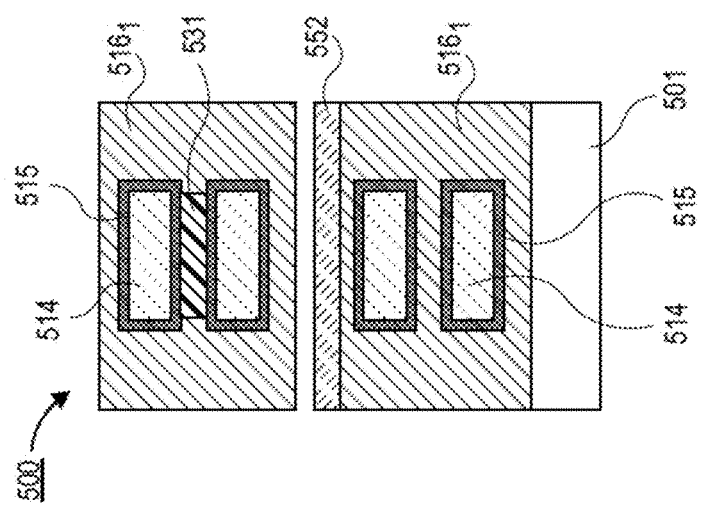

Referring now to FIG. 5B, a cross-sectional illustration of the semiconductor device 500 after a mask layer 552 is disposed over the device 500 is shown, in accordance with an embodiment. In an embodiment, the mask layer 552 is recessed to be below the top semiconductor channels 514. In an embodiment, the mask layer 552 only covers a top surface of the bottom portion of the first workfunction metal $516_1$.

Referring now to FIG. 5C, a cross-sectional illustration of the semiconductor device 500 after the first workfunction metal $516_1$ is removed from the top semiconductor channels 514 is shown, in accordance with an embodiment. Since there is no first workfunction metal $516_1$ in the small spacing (e.g., 10 nm or smaller) between the semiconductor channels 514, the duration of the etching process may be reduced.

Referring now to FIG. 5D, a cross-sectional illustration of the semiconductor device 500 after the sacrificial plug 531 is removed is shown, in accordance with an embodiment. The sacrificial plug 531 may be removed with an etching process that selectively removes the sacrificial plug 531 without damaging the gate dielectric 515.

Referring now to FIG. 5E, a cross-sectional illustration of the semiconductor device 500 after a second workfunction metal $516_2$ is disposed over the semiconductor device 500 is shown, in accordance with an embodiment. In an embodiment, the second workfunction metal $516_2$ may be disposed with an ALD process. The second workfunction metal $516_2$ wraps around the top semiconductor channels 514. Additionally, a layer of the second workfunction metal $516_2$ may be disposed over a top surface of the first workfunction metal $516_1$. The second workfunction metal $516_2$ is a different material than the first workfunction metal $516_1$. For example, the first workfunction metal $516_1$ may be a P-type workfunction material, and the second workfunction metal $516_2$ may be an N-type workfunction material.

Referring now to FIG. 5F, a cross-sectional illustration of the semiconductor device 500 after a gate fill metal 518 is disposed over surfaces is shown, in accordance with an embodiment. The gate fill metal 518 may be tungsten or the like. In an embodiment, the gate fill metal 518 provides electrical coupling between the first transistor $510_1$ and the second transistor $510_2$. Particularly, the gates of the first transistor $510_1$ and the second transistor $510_2$ are controlled together. In an embodiment, the gate fill metal 518 may be tungsten or any other suitable conductive material.

Figure 6:
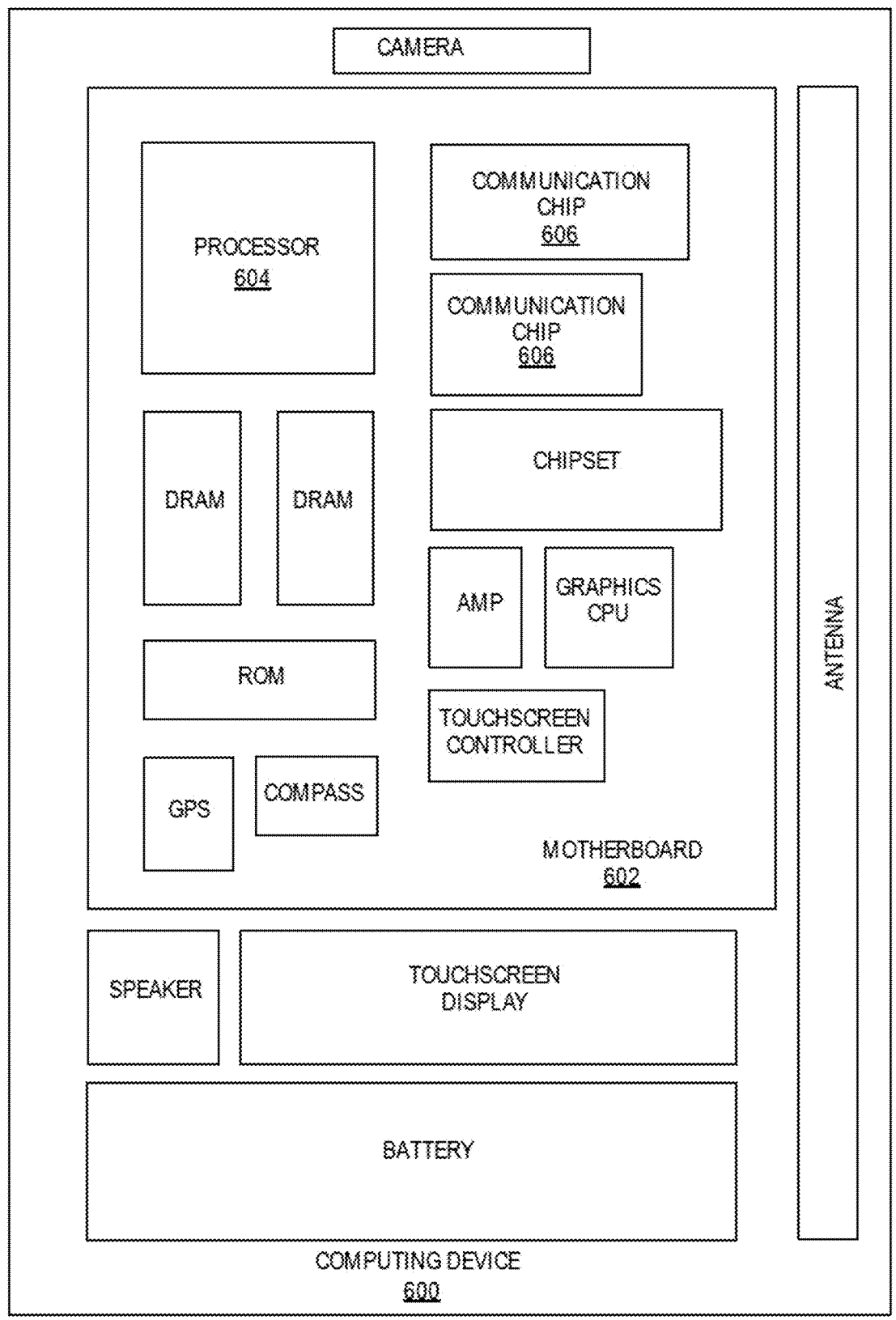
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise a stack comprising a first nanoribbon transistor and a second nanoribbon transistor with a spacing between the two transistors being 50 nm or less or 20 nm or less, such as those described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip may comprise a stack comprising a first nanoribbon transistor and a second nanoribbon transistor with a spacing between the two transistors being 50 nm or less or 20 nm or less, such as those described herein.

In further implementations, another component housed within the computing device 600 may comprise a stack comprising a first nanoribbon transistor and a second nanoribbon transistor with a spacing between the two transistors being 50 nm or less or 20 nm or less, such as those described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
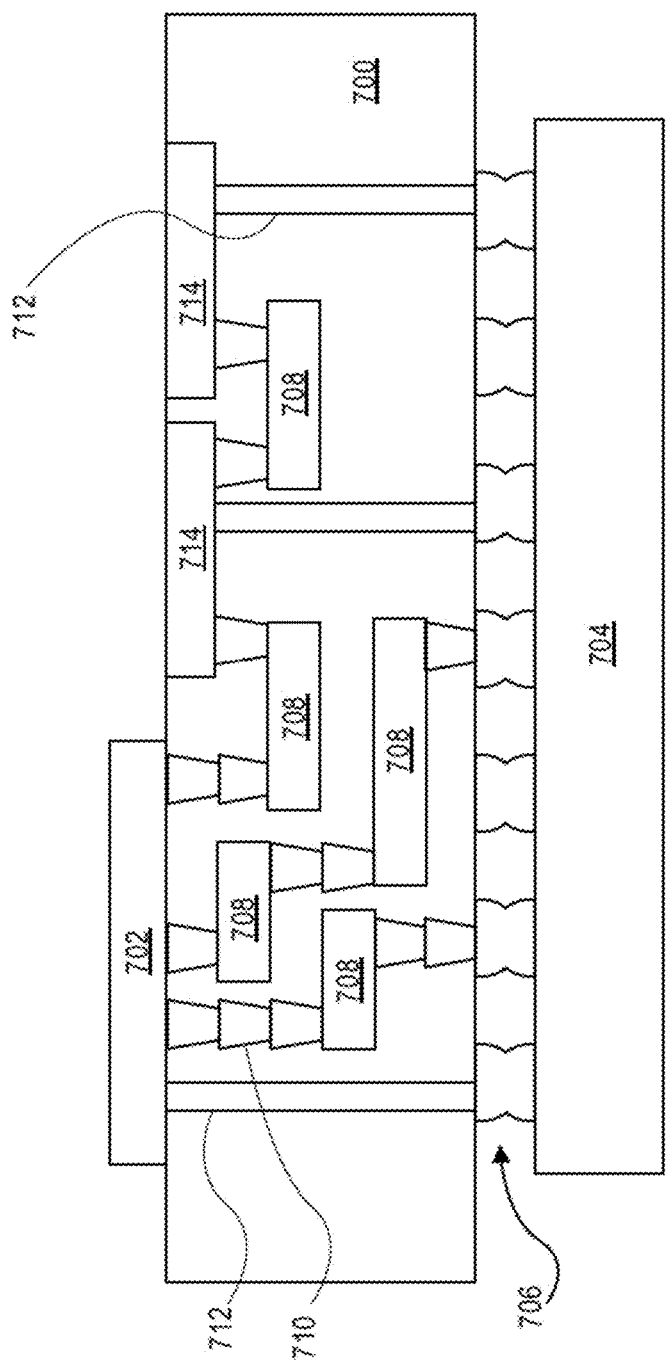
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise a stack comprising a first nanoribbon transistor and a second nanoribbon transistor with a spacing between the two transistors being 50 nm or less or 20 nm or less, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise a stack comprising a first nanoribbon transistor and a second nanoribbon transistor with a spacing between the two transistors being 50 nm or less or 20 nm or less, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a plurality of stacked semiconductor channels, comprising: first semiconductor channels; and second semiconductor channels over the first semiconductor channels, wherein a spacing is between the first semiconductor channels and the second semiconductor channels; a gate dielectric surrounding individual ones of the semiconductor channels of the plurality of stacked semiconductor channels; a first workfunction metal surrounding the first semiconductor channels; and a second workfunction metal surrounding the second semiconductor channels.

Example 2: the semiconductor device of Example 1, wherein the spacing is larger than a second spacing between the first semiconductor channels.

Example 3: the semiconductor device of Example 2, wherein the spacing is approximately 50 nm or less and wherein the second spacing is approximately 10 nm or less.

Example 4: the semiconductor device of Example 3, wherein the spacing is approximately 20 nm or less.

Example 5: the semiconductor device of Examples 1-4, further comprising: a conductive fill layer that is electrically coupled to the first workfunction metal and the second workfunction metal.

Example 6: the semiconductor device of Example 5, wherein a portion of the fill layer is between the first semiconductor channels and the second semiconductor channels.

Example 7: the semiconductor device of Example 6, wherein first workfunction metal contacts three surfaces of the portion of the fill layer, and wherein the second workfunction metal contacts three surfaces of the portion of the fill layer.

Example 8: the semiconductor device of Example 6, wherein the second workfunction metal surrounds a perimeter of the portion of the fill layer.

Example 9: the semiconductor device of Example 5, wherein the fill layer directly contacts the first workfunction metal and the second workfunction metal.

Example 10: the semiconductor device of Example 5, wherein the second workfunction metal separates the fill layer from the first workfunction metal.

Example 11: the semiconductor device of Examples 1-10, wherein the plurality of stacked semiconductor channels are nanoribbon channels or nanowire channels.

Example 12: a method of forming a semiconductor device, comprising: forming a stack of semiconductor channels, comprising: first semiconductor channels; and second semiconductor channels over the first semiconductor channels, wherein a spacing is between the first semiconductor channels and the second semiconductor channels, and wherein a gate dielectric surrounds the first and second semiconductor channels; disposing a first mask over the first semiconductor channels; forming a sacrificial plug between the second semiconductor channels; removing the first mask; disposing a first workfunction metal around the first semiconductor channels and the second semiconductor channels; disposing a second mask over the first semiconductor channels; removing exposed portions of the first workfunction metal surrounding the second semiconductor channels; removing the sacrificial plug; removing the second mask; disposing a second workfunction metal around the second semiconductor channels; and disposing a conductive fill layer over the first workfunction metal and the second workfunction metal.

Example 13: the method of Example 12, wherein the sacrificial plug is etch selective to the gate dielectric.

Example 14: the method of Example 13, wherein the sacrificial plug comprises aluminum and oxygen or silicon and oxygen.

Example 15: the method of Examples 12-14, wherein the sacrificial plug is disposed with an atomic layer deposition (ALD) process.

Example 16: the method of Examples 12-15, wherein the second workfunction metal entirely surrounds the first workfunction metal.

Example 17: the method of Examples 12-15, wherein the second workfunction metal surrounds three surfaces of the first workfunction metal.

Example 18: the method of Examples 12-16, wherein the spacing is larger than a second spacing between the first semiconductor channels.

Example 19: the method of Example 18, wherein the spacing is approximately 50 nm or less and wherein the second spacing is approximately 10 nm or less.

Example 20: the method of Example 19, wherein the spacing is approximately 20 nm or less.

Example 21: a semiconductor device, comprising: a first transistor of a first conductivity type, wherein the first transistor comprises: a first source region; a first drain region; a plurality of first semiconductor channels between the first source region and the first drain region; a first gate dielectric surrounding the plurality of first semiconductor channels; and a first workfunction metal surrounding the first gate dielectric; and a second transistor of a second conductivity type over the first transistor, wherein the second transistor comprises: a second source region; a second drain region; a plurality of second semiconductor channels between the second source region and the second drain region, wherein a bottommost second semiconductor channel is spaced away from a topmost first semiconductor channel by a spacing of approximately 20 nm or less; a second gate dielectric surrounding the plurality of second semiconductor channels; and a second workfunction metal surrounding the second gate dielectric.

Example 22: the semiconductor device of Example 21, further comprising: a gate fill metal, wherein the gate fill metal is electrically coupled to the first workfunction metal and the second workfunction metal.

Example 23: the semiconductor device of Example 21, wherein the second workfunction metal surrounds the first workfunction metal.

Example 24: an electronic system, comprising: a board; an electronic package coupled to the board; and a die electrically coupled to the electronic package, wherein the die comprises: a plurality of stacked semiconductor channels, comprising: first semiconductor channels, wherein the first semiconductor channels have a first spacing; and second semiconductor channels over the first semiconductor channels, wherein the second semiconductor channels have the first spacing, and wherein a second spacing is between the first semiconductor channels and the second semiconductor channels; a gate dielectric surrounding individual ones of the semiconductor channels of the plurality of stacked semiconductor channels; a first workfunction metal surrounding the first semiconductor channels; and a second workfunction metal surrounding the second semiconductor channels.

Example 25: the electronic system of Example 24, wherein the first spacing is approximately 10 nm or less, and wherein the second spacing is approximately 20 nm or less.

What is claimed is:

1. A semiconductor device, comprising:
a plurality of stacked semiconductor channels, comprising:
 a first semiconductor channel; and
 a second semiconductor channel over the first semiconductor channel, wherein a spacing is between the first semiconductor channel and the second semiconductor channel;
a gate dielectric surrounding the first semiconductor channel and the second semiconductor channel;
a first workfunction metal surrounding the first semiconductor channel, wherein a portion of the first workfunction metal nearest the first semiconductor channel has a first width; and
a second workfunction metal surrounding the second semiconductor channel, wherein a portion of the second workfunction metal nearest the second semiconductor channel has a second width, the second width the same as the first width, the second workfunction metal in contact with the first workfunction metal at an interface between the second workfunction metal and the first workfunction metal.

2. The semiconductor device of claim 1, wherein the plurality of stacked semiconductor channels comprises one or more additional semiconductor channels below the first semiconductor channel.

3. The semiconductor device of claim 2, wherein the plurality of stacked semiconductor channels comprises one or more additional semiconductor channels above the second semiconductor channel.

4. The semiconductor device of claim 1, wherein the plurality of stacked semiconductor channels comprises one or more additional semiconductor channels above the second semiconductor channel.

5. The semiconductor device of claim 1, wherein the spacing is approximately 50 nm or less.

6. The semiconductor device of claim 1, further comprising:
a conductive fill layer that is electrically coupled to the first workfunction metal and the second workfunction metal.

7. The semiconductor device of claim 6, wherein a portion of the conductive fill layer is between the first semiconductor channel and the second semiconductor channel.

8. The semiconductor device of claim 7, wherein first workfunction metal contacts three surfaces of the portion of the conductive fill layer, and wherein the second workfunction metal contacts three surfaces of the portion of the conductive fill layer.

9. The semiconductor device of claim 7, wherein the second workfunction metal surrounds a perimeter of the portion of the conductive fill layer.

10. The semiconductor device of claim 6, wherein the conductive fill layer directly contacts the first workfunction metal and the second workfunction metal.

11. The semiconductor device of claim 6, wherein the second workfunction metal separates the conductive fill layer from the first workfunction metal.

12. The semiconductor device of claim 1, wherein the plurality of stacked semiconductor channels are nanoribbon channels or nanowire channels.

13. A computing device, comprising:
a board; and
a component coupled to the board, the component including an integrated circuit structure, comprising:
 a plurality of stacked semiconductor channels, comprising:
  a first semiconductor channel; and
  a second semiconductor channel over the first semiconductor channel, wherein a spacing is between the first semiconductor channel and the second semiconductor channel;
 a gate dielectric surrounding the first semiconductor channel and the second semiconductor channel;
 a first workfunction metal surrounding the first semiconductor channel, wherein a portion of the first workfunction metal nearest the first semiconductor channel has a first width; and
 a second workfunction metal surrounding the second semiconductor channel, wherein a portion of the second workfunction metal nearest the second semiconductor channel has a second width, the second width the same as the first width, the second workfunction metal in contact with the first workfunction metal at an interface between the second workfunction metal and the first workfunction metal.

14. The computing device of claim 13, further comprising:
a memory coupled to the board.

15. The computing device of claim 13, further comprising:
a communication chip coupled to the board.

16. The computing device of claim 13, further comprising:
a battery coupled to the board.

17. The computing device of claim 13, further comprising:
a camera coupled to the board.

18. The computing device of claim 13, further comprising:
a display coupled to the board.

19. The computing device of claim 13, wherein the component is a packaged integrated circuit die.

20. The computing device of claim 13, wherein the component is selected from the group consisting of a processor, a communications chip, and a digital signal processor.

21. A semiconductor device, comprising:
a plurality of stacked semiconductor channels, comprising:
   a first semiconductor channel; and
   a second semiconductor channel over the first semiconductor channel, wherein a spacing is between the first semiconductor channel and the second semiconductor channel;
a gate dielectric surrounding the first semiconductor channel and the second semiconductor channel;
a first workfunction metal surrounding the first semiconductor channel;
a second workfunction metal surrounding the second semiconductor channel, the second workfunction metal in contact with the first workfunction metal at an interface between the second workfunction metal and the first workfunction metal; and
a conductive fill layer that is electrically coupled to the first workfunction metal and the second workfunction metal.

22. The semiconductor device of claim 21, wherein a portion of the conductive fill layer is between the first semiconductor channel and the second semiconductor channel.

23. The semiconductor device of claim 22, wherein first workfunction metal contacts three surfaces of the portion of the conductive fill layer, and wherein the second workfunction metal contacts three surfaces of the portion of the conductive fill layer.

24. The semiconductor device of claim 22, wherein the second workfunction metal surrounds a perimeter of the portion of the conductive fill layer.

25. The semiconductor device of claim 21, wherein the conductive fill layer directly contacts the first workfunction metal and the second workfunction metal.

26. The semiconductor device of claim 21, wherein the second workfunction metal separates the conductive fill layer from the first workfunction metal.

\* \* \* \* \*